United States Patent [19]

Havemann

[11] Patent Number: 4,597,164
[45] Date of Patent: Jul. 1, 1986

[54] TRENCH ISOLATION PROCESS FOR INTEGRATED CIRCUIT DEVICES

[75] Inventor: Robert H. Havemann, Garland, Tex.

[73] Assignee: Texas Instruments Incorporated, Dallas, Tex.

[21] Appl. No.: 646,600

[22] Filed: Aug. 31, 1984

[51] Int. Cl.$^4$ .................... H01L 21/76; H01L 21/265
[52] U.S. Cl. ............................... 29/576 W; 29/576 E; 29/576 B; 29/571; 148/1.5; 148/187; 148/DIG. 82
[58] Field of Search ............ 29/576 W, 576 E, 576 B, 29/571; 148/1.5, 187

[56] References Cited

U.S. PATENT DOCUMENTS

| | | | |
|---|---|---|---|
| 4,170,492 | 10/1979 | Bartlett et al. | 148/1.5 |
| 4,356,211 | 10/1982 | Riseman | 29/576 W |
| 4,412,378 | 11/1983 | Shinada | 29/578 |
| 4,444,605 | 4/1984 | Slawinski | 148/187 |
| 4,463,493 | 8/1984 | Momose | 29/576 W |
| 4,477,310 | 10/1984 | Park et al. | 29/576 W |
| 4,502,913 | 3/1985 | Lechaton et al. | 29/576 W |

OTHER PUBLICATIONS

IBM-TDB, 25 (1983) 6131.

Primary Examiner—Upendra Roy
Attorney, Agent, or Firm—Kenneth C. Hill; Robert O. Groover; James T. Comfort

[57] ABSTRACT

Isolation trenches are formed around selected areas on an integrated circuit device, and highly doped areas are formed in the epitaxial silicon surrounding such trenches. The device is then oxidized at a low temperature, and differential oxidation growth of the highly doped areas causes a thick field oxide to grow outside the trenches while only a thin oxide grows over the selected areas.

11 Claims, 8 Drawing Figures

TRENCH ISOLATION PROCESS FOR INTEGRATED CIRCUIT DEVICES

BACKGROUND AND SUMMARY OF THE INVENTION

The present application is related to co-pending U.S. application Ser. No. 642,320, filed Aug. 20, 1984.

The present invention relates generally to fabrication of integrated circuit devices, and more specifically to a method for isolating selected areas on an integrated circuit device.

DESCRIPTION OF THE PRIOR ART

VLSI technology continues to progress toward higher packing density and improved circuit performance. When scaling VLSI device geometries to a very small degree, device isolation becomes a major design feature. The local oxidation of silicon (LOCOS) has been previously used as an isolation technique of silicon integrated circuits. However, substantial problems have heretofore arisen with LOCOS due to encroachment into the device active area by the field oxide. This oxide encroachment phenomena, often termed the "bird's beak", essentially limits the active area of the device. In addition, with the LOCOS technique, a nitride masking layer is used which causes stress in the silicon and can create defects. The flexing of this nitride layer during field oxidation encroachment also creates an undesirable topography known as "bird's crest".

Techniques have previously been developed to attempt to eliminate "bird's beak" by utilizing a sidewall $Si_3N_4$ film, as described in "Defect Characteristics And Generation Mechanism In A Bird Beak Free Structure By Sidewall Masked Technique", by Fang et al, *Journal of Electro-Chemicals Society: Solid-State Science and Technology*, Vol. 130, No. 1, January, 1983, page 190. Another previously developed technique using thin nitride sidewalls, termed "sidewall masked isolation" (SWAMI), is disclosed in "The Swami-A Defect Free And Near-Zero Bird's Beak Local Oxidation Process And Its Application in VLSI Technology", by Chiu et al, IEDM, 1982, page 224. However, these techniques have not proven to be totally acceptable due to process complexity and defects caused by stress in the silicon generated by the nitride layer.

It is therefore an object of the present invention to provide a method for isolating selected areas on an integrated circuit device which is free from thermal stresses and encroachment of field oxide. It is a further object of the present invention that such a process be compatible with existing fabrication techniques. It is yet another object of the present invention to provide a process which may be done late in the fabrication process sequence in order to improve the quality of integrated circuit devices.

Therefore, according to the present invention, a method is described wherein isolation trenches are formed around selected areas of an integrated circuit device, and filled with an insulating material. Areas of the device in which field oxide is to be grown are etched back and highly doped. When the device is oxidized in steam, the highly doped areas grow oxide at a much greater rate than the selected areas, wherein a thick field oxide is grown, while only a thin oxide grows over the selected areas.

The novel features which characterize the present invention are defined by the appended claims. The foregoing and other objects and advantages of the present invention will hereinafter appear, and for purposes of illustration, but not of limitation, a preferred embodiment is shown in the accompanying drawings.

DESCRIPTION OF THE PREFERRED EMBODIMENT

Figure 1:
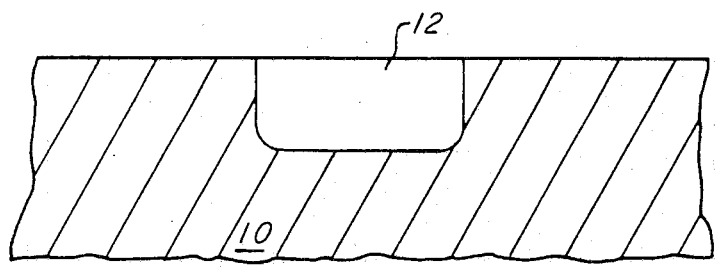
FIGS. 1 through 5 illustrate a preferred method for forming oxide isolated integrated circuit structures according to the present invention.

Referring to FIG. 1, an integrated circuit device 10 contains a selected area 12 having electronic circuits defined therein. For purposes of the present invention, the device 10 can include a substrate and other active and passive devices (not shown). The selected area 12 will generally have active or passive devices (not shown) which must be isolated from the remainder of the circuitry on the device 10. The details of the devices included within the isolated area 12, including any buried layer, channel stops, and so forth, do not form a part of the present invention.

Figure 2:
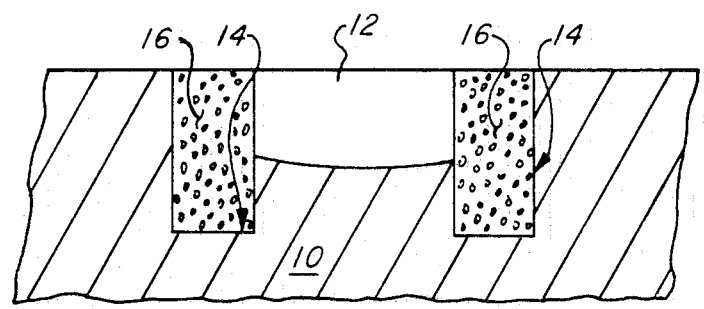

Referring to FIG. 2, a trench 14 is formed which surrounds the selected area 12. This trench 14 is preferably formed after all active devices in the selected area 12 have been fabricated, and just prior to the metalization processes. The trench 14 is then backfilled with an insulator 16. The insulator is preferably formed by growing a thin layer of native, or thermal, oxide typically in the range of 500 to 2000 Angstroms thick, followed by plasma oxide deposition to fill the trench. The insulator 16 can also be formed by growing a thin native oxide layer on the walls of the trench 14, followed by backfill with undoped polycrystalline silicon.

Figure 3:
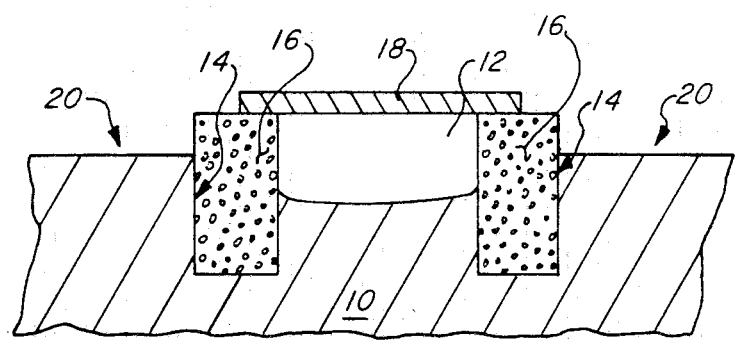

Referring to FIG. 3, a mask layer 18 is deposited and patterned in order to cover the selected area 12. The mask layer 18 is preferably a layer of plasma oxide deposited to a depth of at least approximately 2000 Angstroms. The exposed portions of the device 10 are then etched back by an etch which is selective to silicon over oxide. This results in depressed regions 20 in the device 10. The depressed regions 20 are etched to a depth which is approximately ½ of the depth of the desired field oxide thickness.

Next, a heavy dose of dopant, in the present example preferably arsenic, is implanted into the exposed regions of the substrate 10. The arsenic is preferably implanted at a concentration of approximately $2 \times 10^{16}$ atoms/$CM^2$.

Figure 4:
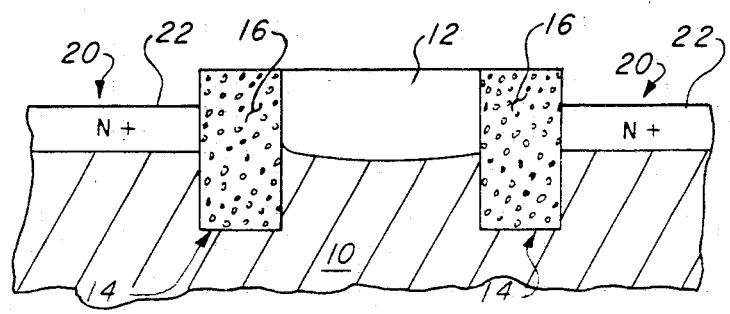

The mask 18, which prevented implant into the selected area 12, is then stripped away. This results in the structure of FIG. 4.

Figure 5:
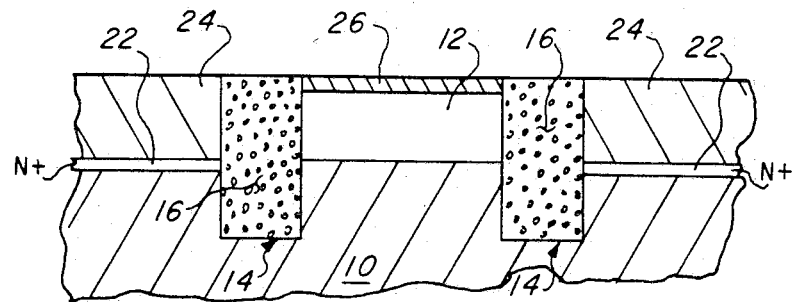

Referring to FIG. 5, the entire device 10 is then oxidized in steam at a low temperature, preferably below approximately 800 degrees C. This results in the highly doped regions 22 converting to oxide at a rate which is much faster than the lesser doped selected region 12, thereby forming field oxide regions 24 which are much greater in thickness than a thin oxide layer 26 over the selected region 12. This process is described in greater detail in co-pending application Ser. No. 642,320, filed on Aug. 20, 1984, and assigned to the assignee of the present invention. A thin remaining doped region 22 may remain under the field oxide 24. This remaining region 22 will be isolated from the selected region 12 by the trenches 14.

Once the steps described above have been completed, the thin oxide layer 26 can be stripped away, or contact holes etched therethrough as desired.

Figure 6:
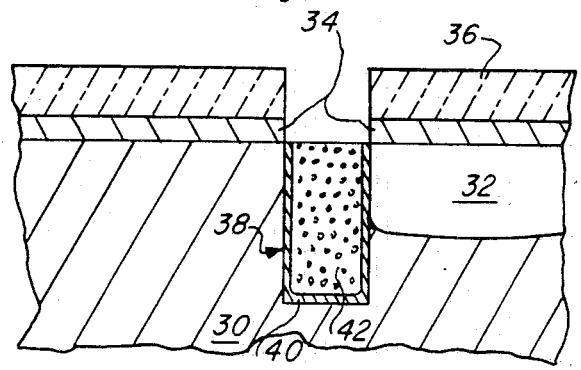
FIGS. 6 through 8 illustrate an alternative method.
Figure 7:
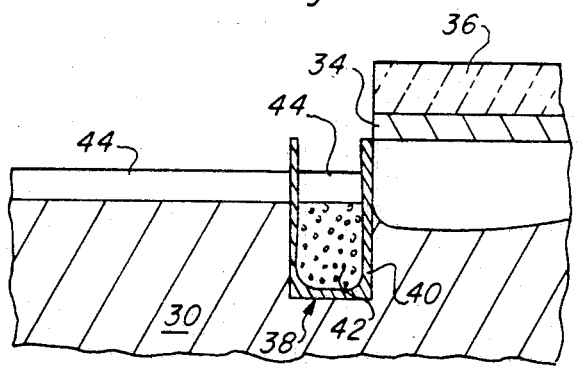
Figure 8:
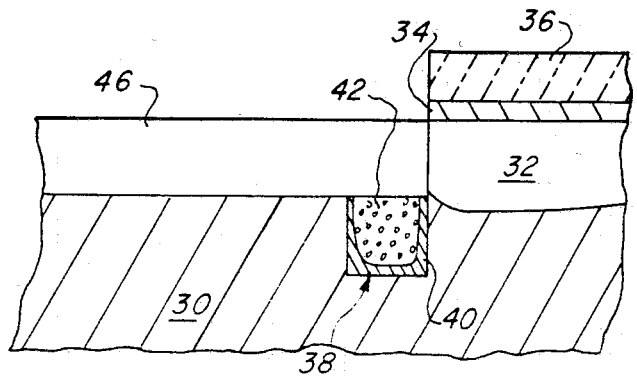

An alternative method is shown in FIGS. 6–8. Referring to FIG. 6, a substrate, or device, 10 contains a selected area 32. A masking layer of oxide 34, preferably approximately 36 Angstroms thick is deposited over the entire slice, followed by a nitride layer 36, approximately 2500 Angstroms thick. A trench 38 is patterned and etched, and a thin layer of native oxide 40 grown therein as described above. The trench 38 is then filled with undoped polycrystalline silicon 42.

A resist mask (not shown) is then formed over the selected area 32, and the exposed nitride 36 and oxide 34 are stripped. The exposed substrate 30 and polysilicon 42 is then etched back and implanted with arsenic, forming doped regions 44. This results in the structure of FIG. 7. FIG. 8 shows the resultant structure after the doped regions 44 are converted to field oxide 46 as described above.

It will be apparent to those skilled in the art that the method described above has many advantages over prior isolation methods. The selected area 12 is surrounded by a very good isolation trench 14, and the field oxide 24 can be grown late in the process sequence because this is done at a relatively low temperature. This low temperature processing minimizes undesired diffusion in the active elements contained in the selected area 12. It will also be noted that there is no encroachment problem, or birds beak, caused by the present isolation method. The growth of the field oxide 24 late in the process allows prior implantation and diffusion processes to take place on a planar surface, thereby increasing the accuracy with which dopants can be placed and masking done, which improves control over device characteristics.

The present invention has been illustrated by the process steps described above, and it will become apparent to those skilled in the art that various modifications and alterations may be made thereto. Such variations fall within the spirit of the present invention, the scope of which is defined by the appended claims.

What is claimed is:

1. A method for isolating a selected area on an integrated circuit device, comprising the steps of:
   (a) providing a silicon integrated circuit substrate having a selected area thereon;
   (b) forming a trench around the selected area;
   (c) forming an insulating barrier in the trench;
   (d) implanting an N+ dopant in the silicon surrounding the trench; and
   (e) thermally forming oxide on the surface of the device in the dopant implanted regions at a substantially faster rate than in the selected area.

2. The method of claim 1, further comprising the step of:
   (f) etching the silicon surrounding the trench to a depth approximately one-half the desired thermal oxide depth prior to performing step (d).

3. The method of claim 1, wherein the selected area comprises an area containing active electronic circuits.

4. The method of claim 1, wherein the dopant is arsenic.

5. The method of claim 1, wherein step (d) comprises heating the chip to a temperature which is low enough so that dopants in any active electronic circuits in the selected area undergo no substantial additional diffusion.

6. The method of claim 1, wherein step (d) comprises heating the chip to a temperature of less than approximately 800° C. in steam.

7. The method of claim 1, wherein step (c) comprises the steps of:
   (f) forming a thin layer of thermal oxide in the trench; and
   (g) filling the remainder of the trench with plasma oxide.

8. The method of claim 3, wherein the trench is formed after the active circuits have been completely formed.

9. The method of claim 7, wherein the thin layer of thermal oxide has a depth in the range of approximately 500 to 2000 Angstroms.

10. A method for isolating a selected area on an integrated circuit device, comprising the steps of:
    (a) providing a silicon integrated circuit substrate having a selected area thereon;
    (b) forming a masking layer over said selected region;
    (c) forming a trench around said selected region aligned with an edge of the masking layer;
    (d) filling the trench with polycrystalline silicon;
    (e) implanting an N+ dopant in the polycrystalline silicon and in the exposed silicon ouside of the trench; and
    (f) thermally forming oxide on the surface of the device in the dopant implanted regions at a faster rate than in the selected area.

11. The method of claim 10, further comprising the step of:
    (g) etching the silicon outside of the trench, and the polycrystalline silicon in the trench, to a depth approximately one-half the desired thermal oxide depth prior to performing step (e).

* * * * *